(12) United States Patent
Chang et al.

(10) Patent No.: US 11,792,923 B2
(45) Date of Patent: Oct. 17, 2023

(54) STORAGE DEVICE FOR FLEXIBLE CIRCUIT PACKAGES AND CARRIER THEREOF

(71) Applicant: CHIPBOND TECHNOLOGY CORPORATION, Hsinchu (TW)

(72) Inventors: Shih-Chieh Chang, Chiayi County (TW); Hui-Yu Huang, Hsinchu (TW); Chih-Ming Peng, Taichung (TW); Chun-Te Lee, Hsinchu County (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 142 days.

(21) Appl. No.: 17/470,038

(22) Filed: Sep. 9, 2021

(65) Prior Publication Data

US 2022/0110209 A1 Apr. 7, 2022

(30) Foreign Application Priority Data

Oct. 7, 2020 (TW) ................. 109134779

(51) Int. Cl.
  *H05K 1/18* (2006.01)
  *H05K 1/02* (2006.01)
  *H05K 1/14* (2006.01)

(52) U.S. Cl.
  CPC ............ *H05K 1/0277* (2013.01); *H05K 1/14* (2013.01); *H05K 1/189* (2013.01); *H05K 2201/09036* (2013.01)

(58) Field of Classification Search
  CPC ........ H05K 1/0277; H05K 1/14; H05K 1/189; H05K 2201/09036

(Continued)

(56) References Cited

U.S. PATENT DOCUMENTS 5,418,692 A * 5/1995 Nemoto ............ H01L 21/67333
                                                            174/559
2004/0124517 A1   7/2004 Hsieh et al.
(Continued)

FOREIGN PATENT DOCUMENTS

CN    101431067 A    5/2009
CN    103253426 A    8/2013
(Continued)

OTHER PUBLICATIONS

Taiwanese Office Action dated Dec. 7, 2020 for Taiwanese Patent Application No. 109134779, 3 pages.

(Continued)

*Primary Examiner* — Binh B Tran
(74) *Attorney, Agent, or Firm* — Demian K. Jackson; Jackson IPG PLLC (57) ABSTRACT

A storage device of the present invention is provided to store flexible circuit packages, each of the flexible circuit packages includes an electronic component and two circuit portions warped at both sides of the electronic component, respectively. The storage device includes a first carrier and a second carrier. The first carrier includes first accommodation elements provided for placement of the flexible circuit packages, and the second carrier includes a first press portion and a second press portion. As the second carrier is placed on the first carrier, the first and second press portions are provided to press the two circuit portions warped upwardly toward the second carrier so as to reduce the warpage of the two circuit portions.

14 Claims, 6 Drawing Sheets

(58) Field of Classification Search
USPC .......................................................... 361/749
See application file for complete search history.

(56) References Cited

U.S. PATENT DOCUMENTS

2008/0173569 A1* 7/2008 Forsyth ............. H01L 21/67333
206/725
2019/0148173 A1 5/2019 Taguchi

FOREIGN PATENT DOCUMENTS

| CN | 103681524 | A | 3/2014 |
| CN | 206203064 | U | 5/2017 |
| CN | 110197798 | A | 9/2019 |
| CN | 211520398 | U | 9/2020 |
| JP | 61-156674 | U | 9/1986 |
| JP | 63-003977 | U | 1/1988 |
| JP | 2016-150789 | A | 8/2016 |
| JP | 2017-69444 | A | 4/2017 |
| TW | M551752 | | 11/2017 |
| WO | 2006/087769 | A1 | 8/2006 |

OTHER PUBLICATIONS

Chinese Office Action dated Dec. 2, 2022 for Chinese Patent Application No. 202011204216.1, 9 pages.
Japanese Notice of Allowance dated Dec. 1, 2022 for Japanese Patent Application No. 2021-145910, 3 pages.
Japanese Office Action dated Aug. 22, 2022 for Japanese Patent Application No. 2021-145910, 4 pages.
Chinese Notice of Allowance dated Jul. 31, 2023 for Chinese Patent Application No. 202011204216.1, 3 pages.

* cited by examiner

STORAGE DEVICE FOR FLEXIBLE CIRCUIT PACKAGES AND CARRIER THEREOF

FIELD OF THE INVENTION

This invention relates to a storage device and its carrier, and more particularly to a storage device and its carrier which is provided to press a circuit portion of a flexible circuit package.

BACKGROUND OF THE INVENTION

During manufacture of conventional flexible circuit packages, a plurality of chips are mounted on a flexible substrate, and the flexible substrate is diced into a plurality of flexible circuit packages each including a chip and a circuit portion. However, the warpage of the circuit portion of each flexible circuit packages may be caused after substrate dicing owing to the flexible substrate is made of flexible material, e.g. polyimide (PI), and the flexible circuit package having the warped circuit portion is not easy to be bonded to an electronic component.

SUMMARY

One object of the present invention is to provide a storage device used to hold flexible circuit packages and press warped circuit portions located at both sides of the flexible circuit package such that the circuit portions can be flatter.

A storage device of the present invention includes a first carrier and a second carrier. The first carrier includes first accommodation elements provided to accommodation flexible circuit packages, and each of the first accommodation elements includes a first base, a plurality of first support ribs and a first accommodation groove. The first support ribs are located around the first accommodation groove. The first base is located at bottom of the first accommodation groove and includes a first carry portion, a first avoidance groove and a second avoidance groove. The first and second avoidance grooves are recessed on a top surface of the first base and located at both sides of the first carry portion, respectively. The first carry portion is used to carry an electronic component of each of the flexible circuit packages such that two circuit portions of each of the flexible circuit packages, which are warped at both sides of the electronic component respectively, are located above the first and second avoidance grooves, respectively. The second carrier includes second accommodation elements each including a second base, a plurality of second support ribs and a second accommodation groove. The second support ribs are located around the second accommodation groove. The second base is located at bottom of the second accommodation groove and includes a first press portion and a second press portion which protrude from a bottom surface of the second base and are located above the first and second avoidance grooves, respectively. When the second carrier is placed on the first carrier, each of the first support ribs is inserted into a limitation groove of each of the second support ribs such that a first space exists between the first press portion and the first avoidance groove and a second space exists between the second press portion and the second avoidance groove. The first and second spaces are provided to accommodate the two circuit portions warped at both sides of the electronic component, respectively. The first and second press portions are provided to press the two circuit portions warped

2 upwardly toward the second carrier so as to minimize the warpage of the two circuit portions.

The first and second press portions of the second carrier stacked on the first carrier are provided to press the circuit portions warped toward the second carrier to minimize the warpage of the circuit portions such that the warped circuit portions become flatter.

DETAILED DESCRIPTION OF THE INVENTION

Figure 1:
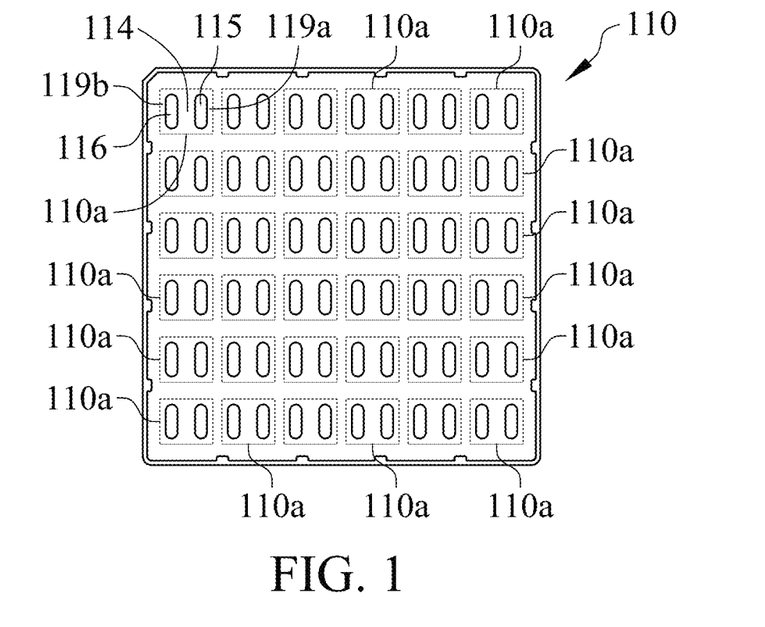
FIG. 1 is a top view diagram illustrating a first carrier of a storage device in accordance with one embodiment of the present invention.
Figure 2:
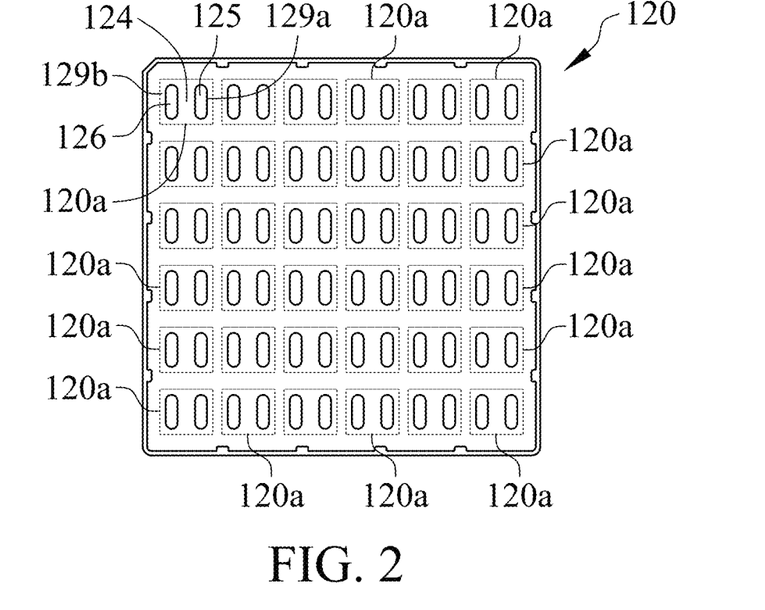
FIG. 2 is a top view diagram illustrating a second carrier of the storage device in accordance with one embodiment of the present invention.
Figure 3:
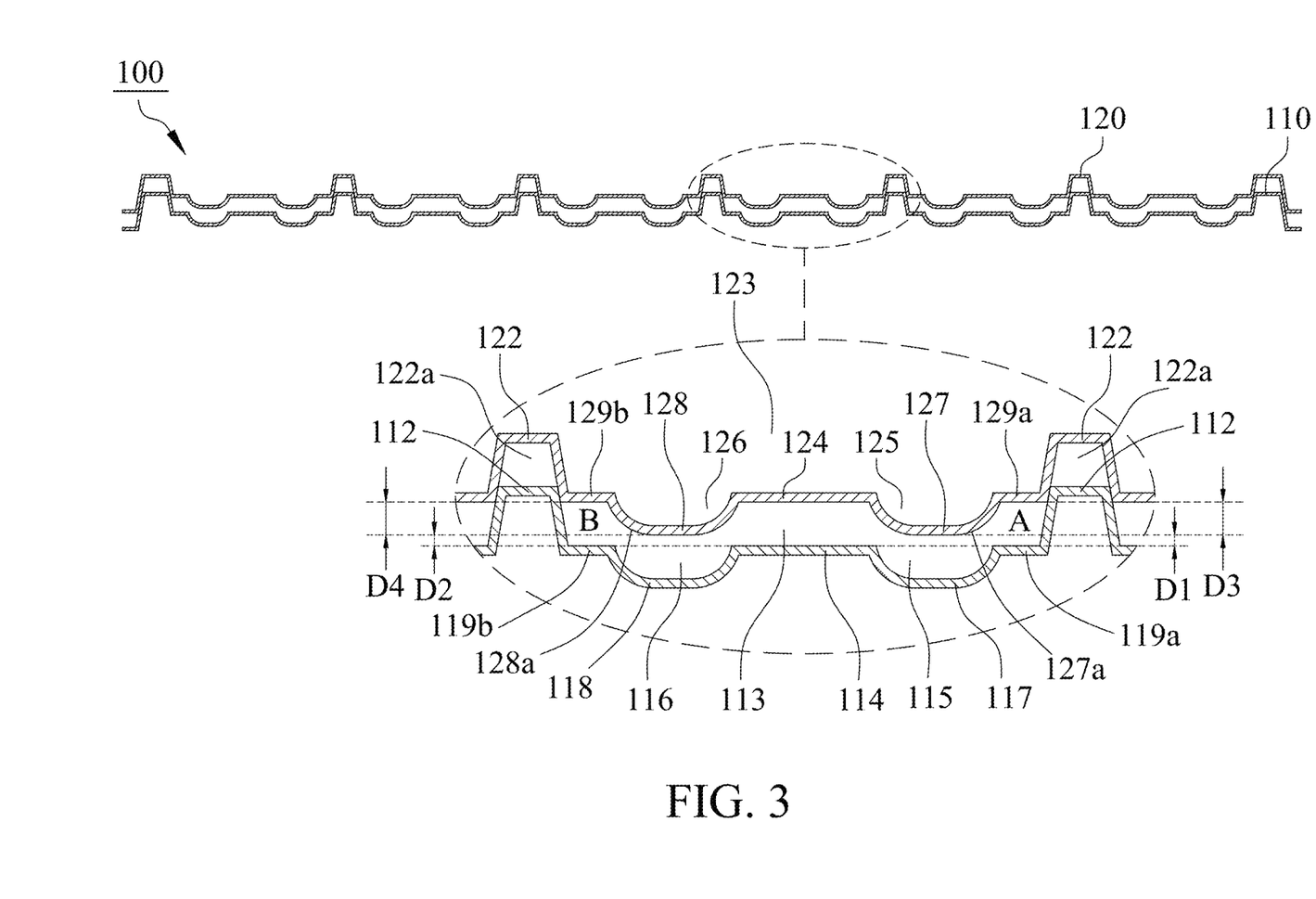
FIG. 3 is a cross-section view diagram illustrating the storage device in accordance with one embodiment of the present invention.
Figure 7:
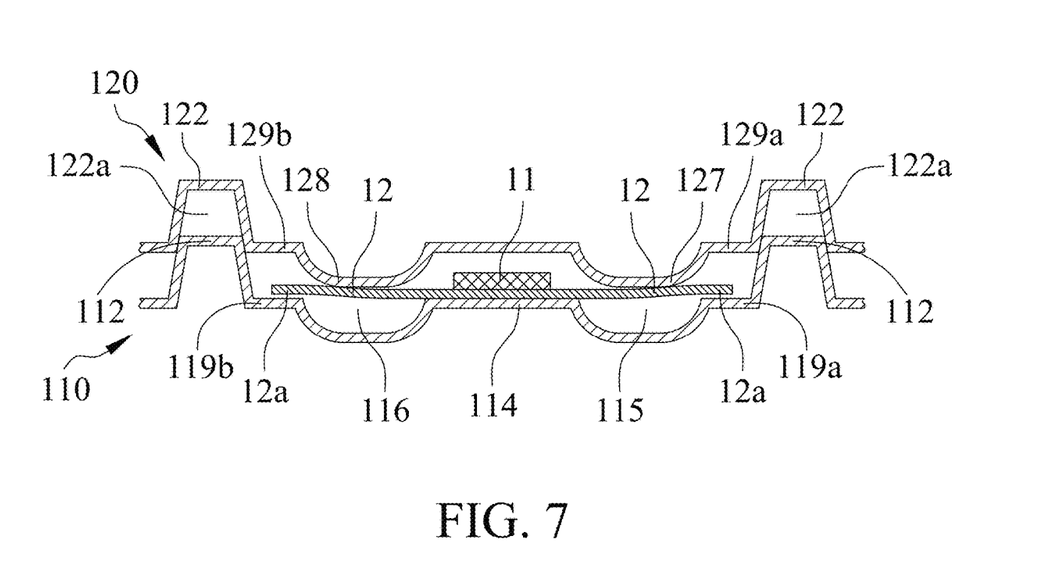
FIG. 7 is a cross-section view diagram illustrating a part of the storage device in accordance with one embodiment of the present invention.
Figure 8:
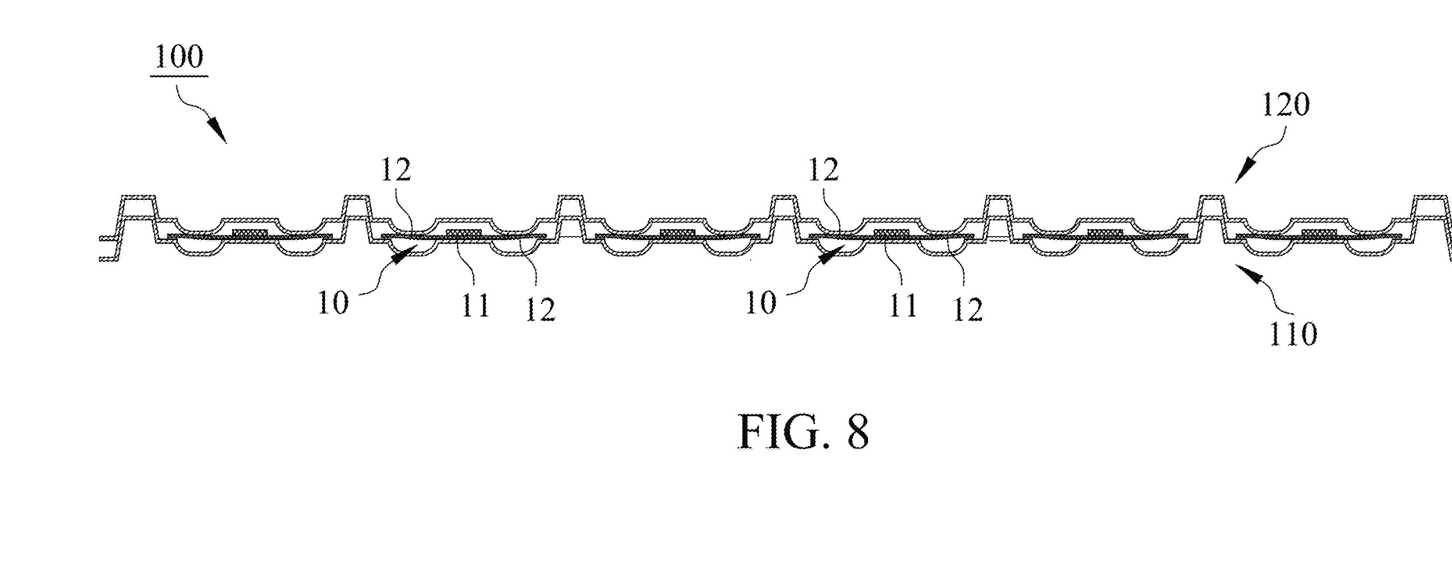
FIG. 8 is a cross-section view diagram illustrating the storage device in accordance with one embodiment of the present invention.

With reference to FIGS. 1 to 3, a storage device 100 of the preset invention is provided to storage flexible circuit packages 10 (as shown in FIG. 8). Each of the flexible circuit packages 10 includes an electronic component 11 and two circuit portions 12 which are warped at both sides of the electronic component 11, respectively. The storage device 100 at least includes a first carrier 110 and a second carrier 120 which is stacked on the first carrier 110. The flexible circuit packages 10 are placed between the first carrier 110 and the second carrier 120 as shown in FIG. 7.

Figure 4:
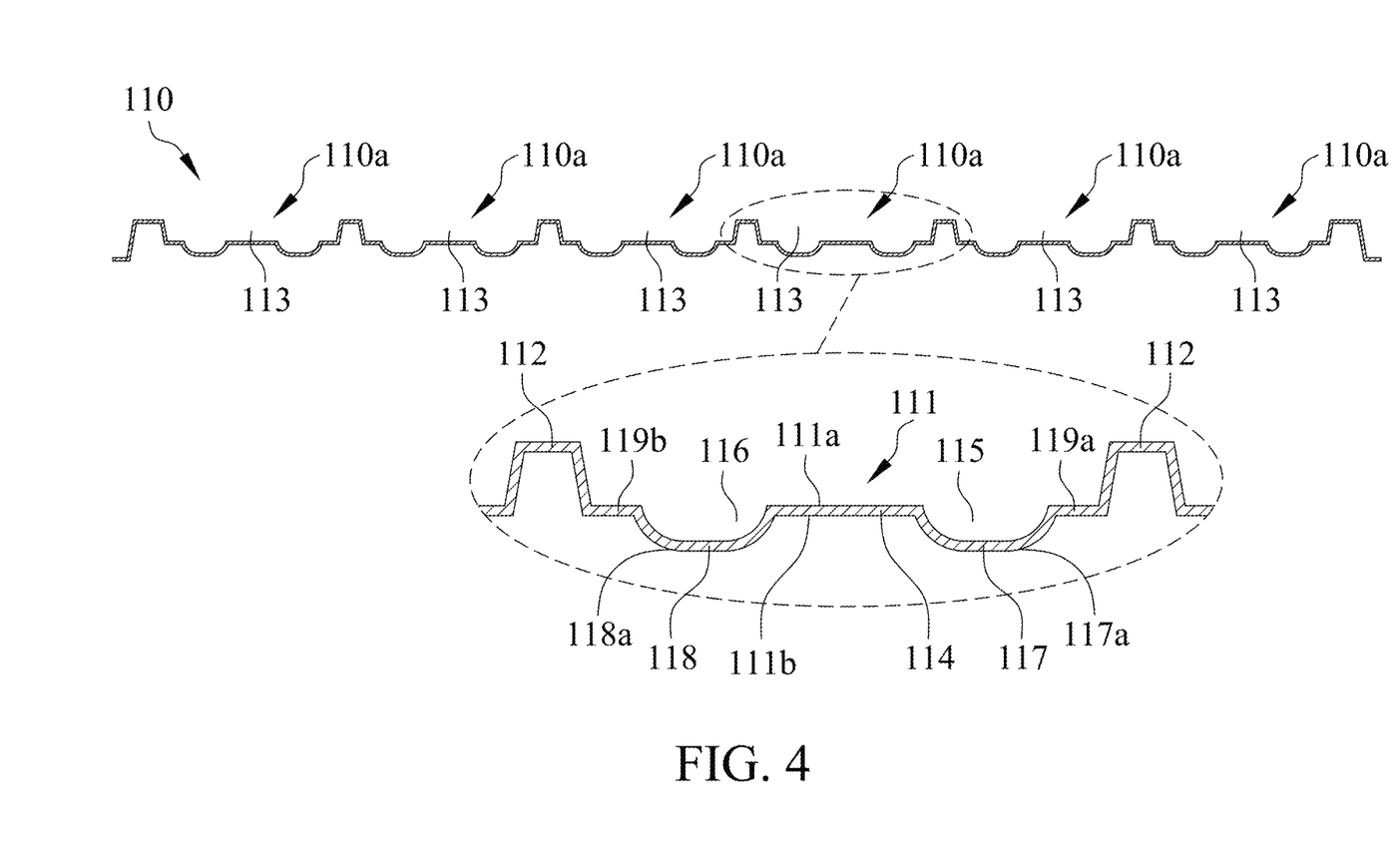
FIG. 4 is a cross-section view diagram illustrating the first carrier of the storage device in accordance with one embodiment of the present invention.

With reference to FIGS. 1, 3 and 4, the first carrier 110 includes a plurality of first accommodation elements 110a used for the placement of the flexible circuit packages 10. In this embodiment, each of the first accommodation elements 110a includes a first base 111, a plurality of first support ribs 112 and a first accommodation groove 113. The first support ribs 112 are located around the first accommodation groove 113, and the first base 111 is located at bottom of the first accommodation groove 113.

Figure 6:
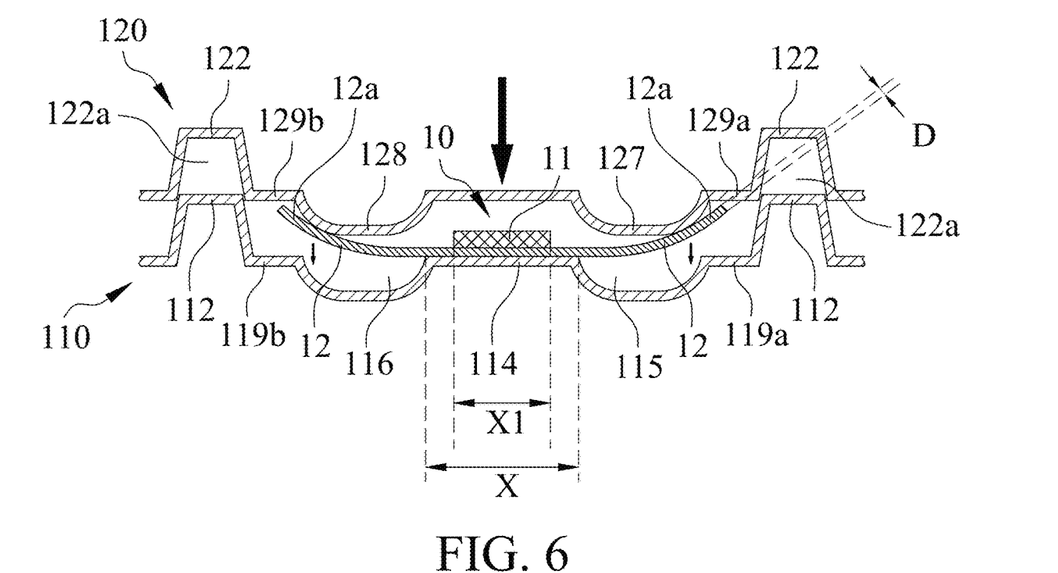
FIG. 6 is a cross-section view diagram illustrating a part of the storage device in accordance with one embodiment of the present invention.

With reference to FIGS. 3 and 4, the first base 111 includes a first carry portion 114, a first avoidance groove 115 and a second avoidance groove 116. The first carry portion 114 is provided for carrying the electronic component 11 of the flexible circuit package 10. The first avoidance groove 115 and the second avoidance groove 116 are recessed on a top surface 111a of the first base 111 and located at both sides of the first carry portion 114, respectively. With reference to FIG. 6, while the flexible circuit package 10 is placed on the first accommodation element 110a, the profile of the electronic component 11 defines an area X1 on the first carry portion 114 and the two warped circuit portions 12 located at both sides of the electronic component 11 are located above the first avoidance groove 115 and the second avoidance groove 116, respectively. The area X1 defined by the electronic component 11 located on the first carry portion 114 is less than an area X of the first carry portion 114.

With reference to FIGS. 3 and 4, preferably, the first base 111 further includes a first side-carry portion 119a and a second side-carry portion 119b. The first avoidance groove 115 is located between the first side-carry portion 119a and the first carry portion 114, and the second avoidance groove 116 is located between the second side-carry portion 119b and the first carry portion 114. As shown in FIG. 6, conductive terminals 12a of the two circuit portions 12 are located above the first side-carry portion 119a and the second side-carry portion 119b, respectively when the flexible circuit package 10 is placed on the first accommodation element 110a. The first side-carry portion 119a and the second side-carry portion 119b are provided for carrying the conductive terminals 12a which are pressed downwardly.

With reference to FIG. 4, the first base 111 of this embodiment further includes a third press portion 117 and a fourth press portion 118 which protrude from a bottom surface 111b of the first base 111. The third press portion 117 is located under the first avoidance groove 115 and has a third contact surface 117a, and the fourth press portion 118 is located under the second avoidance groove 116 and has a fourth contact surface 118a. Preferably, the third contact surface 117a and the fourth contact surface 118a are curved.

Figure 5:
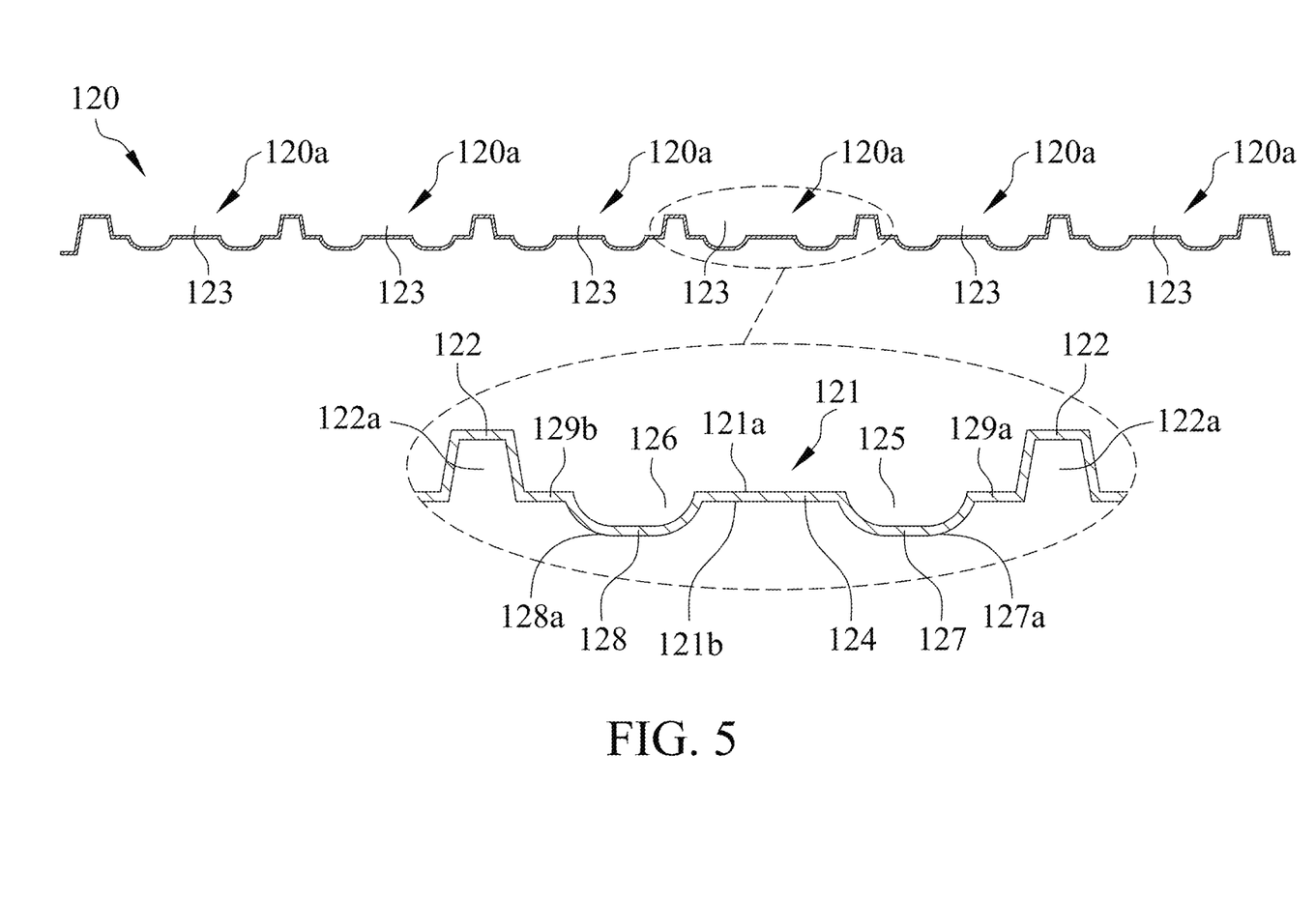
FIG. 5 is a cross-section view diagram illustrating the second carrier of the storage device in accordance with one embodiment of the present invention.

With reference to FIGS. 2, 3 and 5, the second carrier 120 includes a plurality of second accommodation elements 120a, and each of the second accommodation elements 120a includes a second base 121, a plurality of second support ribs 122, a second accommodation groove 123, a first press portion 127 and a second press portion 128. The second support ribs 122 are located around the second accommodation groove 123, and the second base 121 is located at bottom of the second accommodation groove 123.

With reference to FIGS. 5 and 7, the first press portion 127 and the second press portion 128 protrude from a bottom surface 121b of the second base 121 and are located above the first avoidance groove 115 and the second avoidance groove 116 respectively while the second carrier 120 is placed on the first carrier 110.

With reference to FIGS. 3 and 5, the second base 121 of this embodiment further includes a second carry portion 124, a third avoidance groove 125, a fourth avoidance groove 126, a third side-carry portion 129a and a fourth side-carry portion 129b. The third avoidance groove 125 and the fourth avoidance groove 126 are recessed on a top surface 121a of the second base 121 and located at both sides of the second carry portion 124, respectively. The third avoidance groove 125 is located between the third side-carry portion 129a and the second carry portion 124, and the fourth avoidance groove 126 is located between the fourth side-carry portion 129b and the second carry portion 124. Preferably, the first carrier 110 and the second carrier 120 have the same appearance.

With reference to FIG. 3, when the second carrier 120 is placed on the first carrier 110, each of the first support ribs 112 is inserted into a limitation groove 122a of each of the second support ribs 122 such that a first space A exists between the first press portion 127 and the first avoidance groove 115 and a second space B exists between the second press portion 128 and the second avoidance groove 116.

With reference to FIGS. 3, 6 and 7, the first space A and the second space B are provided for accommodating the two warped circuit portions 12 located at both sides of the electronic component 11, respectively, and the first press portion 127 and the second press portion 128 are provided for press the two circuit portions 12 which are warped upwardly toward the second carrier 120, respectively. Preferably, a first contact surface 127a of the first press portion 127 and a second contact surface 128a of the second press portion 128 are curved.

With reference to FIGS. 3, 6 and 7, while the second carrier 120 is placed on the first carrier 110, the third side-carry portion 129a is located above the first side-carry portion 119a, the fourth side-carry portion 129b is located above the second side-carry portion 119b, a first distance D1 exists between the first contact surface 127a of the first press portion 127 and the top surface 111a of the first base 111, a second distance D2 exists between the second contact surface 128a of the second press portion 128 and the top surface 111a of the first base 111, a first avoidance interval D3 exists between the third side-carry portion 129a and the first side-carry portion 119a, and a second avoidance interval D4 exists between the fourth side-carry portion 129b and the second side-carry portion 119b.

With reference to FIGS. 3, 6 and 7, the first distance D1 and the second distance D2 are greater than or equal to a thickness D of each of the circuit portions 12, the first avoidance interval D3 is greater than the first distance D1, and the second avoidance interval D4 is greater than the second distance D2.

With reference to FIGS. 6 and 7, after placing the flexible circuit package 10 on the first accommodation element 110a of the first carrier 110 and then placing the second carrier 120 on the first carrier 110, the first press portion 127 and the second press portion 128 can press the two circuit portions 120 warped upwardly toward the second carrier 120, respectively, to reduce the warpage of the circuit portions 12 and make the circuit portions 12 be flatter. Due to the circuit portions 12 consist of flexible substrate and metal wires, the warpage of the circuit portions 12 can be minimized as the first press portion 127 and the second press portion 128 press the circuit portions 12 bent upwardly toward the second carrier 120.

With reference to FIGS. 3, 6 and 7, the first distance D1 and the second distance D2 are greater than or equal to the thickness D of the circuit portions 12 and the first contact surface 127a and the second contact surface 128a are curved, so the circuit portions 12 are protected from pressure damages caused by the first press portion 127 and the second press portion 128. Moreover, the third side-carry portion 129a and the fourth side-carry portion 129b will not damage the conductive terminal 12a of each of the circuit portions 12 because the first avoidance interval D3 is greater than the first distance D1 and the second avoidance interval D4 is greater than the second distance D2.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A storage device for a plurality of flexible circuit packages each including an electronic component and two circuit portions respectively warped at both sides of the electronic component comprising:

a first carrier including a plurality of first accommodation elements configured to accommodation the plurality of flexible circuit packages, respectively, each of the plurality of first accommodation elements includes a first accommodation groove, a plurality of first support ribs and a first base, the plurality of first support ribs are located around the first accommodation groove, the first base is located at bottom of the first accommodation groove and includes a first carry portion, a first avoidance groove and a second avoidance groove, the first and second avoidance grooves are recessed on a top surface of the first base and located at both sides of the first carry portion, respectively, the first carry portion is configured to carry the electronic component such that the two circuit portions respectively warped at both sides of the electronic component are located above the first and second avoidance grooves, respectively; and a second carrier including a plurality of second accommodation elements, each of the plurality of second accommodation elements includes a second accommodation groove, a plurality of second support ribs and a second base, the plurality of second support ribs are located around the second accommodation groove, the second base is located at bottom of the second accommodation groove and includes a first press portion and a second press portion which protrude from a bottom surface of the second base and are located above the first and second avoidance grooves, respectively, wherein when the second carrier is placed on the first carrier, each of the plurality of first support ribs is inserted into a limitation groove of each of the plurality of second support ribs such that a first space exists between the first press portion and the first avoidance groove and a second space exists between the second press portion and the second avoidance groove, the first and second spaces are configured to accommodate the two circuit portions warped at both sides of the electronic component, respectively, and the first and second press portions are configured to press the two circuit portions warped upwardly toward the second carrier so as to reduce the warpage of the two circuit portions, wherein the first base further includes a first side-carry portion and a second side-carry portion, the first avoidance groove is located between the first side-carry portion and the first carry portion and the second avoidance groove is located between the second side-carry portion and the first carry portion, and conductive terminals of the two circuit portions are located above the first and second side-carry portions, respectively.

2. The storage device in accordance with claim 1, wherein a first contact surface of the first press portion is curved.

3. The storage device in accordance with claim 2, wherein a second contact surface of the second press portion is curved.

4. The storage device in accordance with claim 1, wherein the first and second side-carry portions are configured to carry the conductive terminals of the two circuit portions which are pressed by the first and second press portions, respectively.

5. The storage device in accordance with claim 1, wherein a first distance exists between a first contact surface of the first press portion and the top surface of the first base, the first distance is greater than or equal to a thickness of each of the two circuit portions.

6. The storage device in accordance with claim 5, wherein a second distance exists between a second contact surface of the second press portion and the top surface of the first base, the second distance is greater than or equal to the thickness of each of the two circuit portions.

7. The storage device in accordance with claim 6, wherein the second base includes a second carry portion, a third avoidance groove, a fourth avoidance groove, a third side-carry portion and a fourth side-carry portion, the third and fourth avoidance grooves are recessed on a top surface of the second base and located at both sides of the second carry portion, respectively, the third avoidance groove is located between the third side-carry portion and the second carry portion, the fourth avoidance groove is located between the fourth side-carry portion and the second carry portion, the third side-carry portion is located above the first side-carry portion, a first avoidance interval exists between the third and first side-carry portions, and the first avoidance interval is greater than the first distance.

8. The storage device in accordance with claim 7, wherein the fourth side-carry portion is located above the second side-carry portion, a second avoidance interval exists between the fourth and second side-carry portions, and the second avoidance interval is greater than the second distance.

9. The storage device in accordance with claim 7, wherein the first base further includes a third press portion and a fourth press portion which protrude from a bottom surface of the first base, the third press portion is located under the first avoidance groove, the fourth press portion is located under the second avoidance groove, and the first and second carriers have the same appearance.

10. The storage device in accordance with claim 1, wherein an area defined by a profile of the electronic component on the first carry portion is less than an area of the first carry portion.

11. A carrier of storage device configured to carry a plurality of flexible circuit packages each including an electronic component and two circuit portions warped at both sides of the electronic component respectively, the carrier including a plurality of accommodation elements, each of the plurality of accommodation elements comprising:

an accommodation groove;

a plurality of support ribs located around the accommodation groove; and a base located at bottom of the accommodation groove and including a carry portion, a first avoidance groove and a second avoidance groove, the first and second avoidance grooves are recessed on a top surface of the base and located at both sides of the carry portion, respectively, the carry portion is configured to carry the electronic component such that the two circuit portions warped at both sides of the electronic component are located above the first and second avoidance grooves, respectively, wherein the base further includes a first side-carry portion and a second side-carry portion, the first avoidance groove is located between the first side-carry portion and the carry portion, the second avoidance groove is located between the second side-carry portion and the carry portion, the first and second side-carry portions are configured to carry the two circuit portions, respectively.

12. The carrier of storage device in accordance with claim 11, wherein the base further includes a third press portion and a fourth press portion which protrude from a bottom surface of the base, the third press portion is located under the first avoidance groove, and the fourth press portion is located under the second avoidance groove.

13. The carrier of storage device in accordance with claim 12, wherein a contact surface of the third press portion is curved.

14. The carrier of storage device in accordance with claim 13, wherein a contact surface of the fourth press portion is curved.

\* \* \* \* \*